US008060323B2

(12) United States Patent
Taniguchi et al.

(10) Patent No.: US 8,060,323 B2
(45) Date of Patent: Nov. 15, 2011

(54) SECONDARY-BATTERY LIFE ESTIMATION APPARATUS AND METHOD

(75) Inventors: Akihiro Taniguchi, Hyogo (JP); Takuma Iida, Osaka (JP)

(73) Assignee: Panasonic Corporation, Osaka (JP)

( * ) Notice: Subject to any disclaimer, the term of this patent is extended or adjusted under 35 U.S.C. 154(b) by 464 days.

(21) Appl. No.: 12/203,411

(22) Filed: Sep. 3, 2008

(65) Prior Publication Data

US 2009/0070052 A1    Mar. 12, 2009

(30) Foreign Application Priority Data

Sep. 7, 2007    (JP) ................. 2007-232332

(51) Int. Cl.
*G06F 19/00*    (2006.01)
*H02J 7/00*    (2006.01)
*G01N 27/416*    (2006.01)
(52) U.S. Cl. ............................ 702/63; 320/132; 324/429
(58) Field of Classification Search .................... 702/63, 702/57; 324/429, 433; 320/132, 134
See application file for complete search history.

(56) References Cited

U.S. PATENT DOCUMENTS

| 7,078,907 B2 * | 7/2006 | Uesaka et al. ................. 324/429 |
| 2006/0273802 A1 * | 12/2006 | Murakami et al. ............. 324/434 |
| 2007/0145949 A1 * | 6/2007 | Matsushima et al. .......... 320/132 |

FOREIGN PATENT DOCUMENTS

| JP | 2-61066 | 5/1990 |
| JP | 2001-186684 A | 7/2001 |
| JP | 2004-191152 A | 7/2004 |
| JP | 2005-235420 | 9/2005 |
| JP | 2006-098134 A | 4/2006 |
| JP | 2007-078672 A | 3/2007 |

OTHER PUBLICATIONS

Tsujkawa, Tomonobu et al., "Development of High Performance VRLA Batteries Technology and Management System," NTT Facilites Research and Development Headquarters, vol. 50, No. 8, pp. 569-575, 2001.
Japanese Notice of Reasons for Rejection, w/ English translation thereof, issued in Japanese Patent Application No. JP 2008-217948 dated Sep. 28, 2010.

* cited by examiner

*Primary Examiner* — Bryan Bui
(74) *Attorney, Agent, or Firm* — McDermott Will & Emery LLP

(57) ABSTRACT

A secondary-battery life estimation apparatus includes: a voltage measuring portion measuring a terminal voltage of a secondary battery to be measured; a first memory storing in advance a terminal voltage $V_0$ of a non-degraded secondary battery before the non-degraded secondary battery discharges after fully charged; a second memory which stores in advance a life-estimation data map as a look-up table associating a voltage difference dV between a terminal voltage V of the secondary battery to be measured before the secondary battery to be measured discharges after fully charged and the terminal voltage $V_0$ with a residual life of the secondary battery to be measured; and a CPU calculating the voltage difference dV between the terminal voltage V measured by the voltage measuring portion before the secondary battery to be measured discharges after fully charged and the terminal voltage $V_0$ stored in the first memory and estimating the residual life of the secondary battery to be measured based on the life-estimation data map stored in the second memory using the voltage difference dV.

11 Claims, 2 Drawing Sheets

SECONDARY-BATTERY LIFE ESTIMATION APPARATUS AND METHOD

BACKGROUND OF THE INVENTION

1. Field of the Invention

The present invention relates to a secondary-battery life estimation apparatus for an apparatus provided with a secondary battery, and a life estimation method for the secondary battery.

2. Description of the Background Art

In recent years, a secondary battery has often been used as a power supply system in combination with a solar battery, or a power generator driven by natural energy such as wind power and hydraulic power or artificial mechanical power such as an internal combustion engine. A power supply system combined with such a storage unit stores excess power in the storage unit and supplies electric power from the storage unit to a load apparatus if necessary, thereby utilizing energy more efficiently.

As an example of this system, there is a solar-light power-generation system charging a storage unit with excess power when the amount of power generated by solar light is greater than a power consumption in a load apparatus, and oppositely, when the amount of generated power is smaller than a power consumption in the load apparatus, driving the load apparatus with electric power outputted from the storage unit.

Therefore, the solar-light power-generation system is capable of storing excess power conventionally out of use in the storage unit, thereby enhancing the energy efficiency compared with a conventional power supply system.

In order to store excess power efficiently in the storage unit, the solar-light power-generation system executes control lest the state of charge (below called SOC) of the storage unit should reach 100%, and in order to drive the load apparatus if necessary, it executes control lest the SOC should fall to zero. Specifically, the storage unit is controlled in such a way that the SOC is within a range of 20 to 80%.

This principle is applied to a hybrid electric vehicle (HEV) provided with an engine and a motor. The HEV drives a dynamo and charges a storage unit with excess power if the power outputted from the engine is greater than motive power required for driving, and charges the storage unit by using a motor as a dynamo when braking or slowing.

In addition, great notice has recently been taken of a load-leveling power supply or a plug-in hybrid electric vehicle making effective use of nighttime power.

The load-leveling power supply is a system which stores electric power in a storage unit in the night when the power consumption declines and the power rates lower and consumes the stored power in the daytime when the power consumption peaks. The leveled power consumption leads to constant power generation, thereby enabling power facilities to operate efficiently, or cutting down on an investment in the facilities.

The plug-in hybrid electric vehicle utilizing nighttime power mainly operates EV (electric vehicle) driving which supplies electric power from the storage unit when running at a poor mileage in the streets and operates HEV driving which utilizes an engine and a motor when running over a long distance, thereby reducing the total emission quantity of $CO_2$.

As repeatedly used, a storage device is degraded, thereby lowering the capacity and raising the impedance. If the capacity falls to a reference value or below, of if the impedance rises to a reference value or above, then the storage device needs to be replaced. If the storage device degraded beyond each reference value is continuously used, for example, an emergency back-up power supply can have trouble, thereby requiring a regular knowledge of the capacity or impedance of the storage device in use.

However, it generally takes a long time to measure the capacity of the storage device accurately. For example, a small nickel-hydrogen storage battery is charged for sixteen hours with 0.1 C(mA) after discharged up to a cell terminal voltage of 1.0 V. Then, it is not given a charge or a discharge for an hour, and thereafter, discharged with 0.2 C(mA) up to a cell terminal voltage of 1.0 V. The discharge capacity taken out at this time is a real capacity. Herein, 1 C (=1It) is a current value for nullifying the residual capacity of a secondary battery in an hour when the secondary battery discharges a nominal capacity with a constant current.

Accordingly, measuring a capacity takes a whole day or so, and besides, since a battery cannot be put into operation while the capacity thereof is being measured, preferably, the capacity should not be measured too frequently. Particularly, if a large battery is provided with a dedicated artificial load for discharge, that requires a load for a great amount of electric current, thereby raising costs.

In order to solve the problems, a method has been proposed for estimating the capacity of a secondary battery within a shorter period of time. For example, a method for precisely estimating the capacity of a nickel-hydrogen battery in a short time without measuring a discharge capacity of the battery in practice is offered (e.g., refer to Japanese Patent Laid-Open Publication No. 2005-235420). This says that the battery capacity can be estimated based on a correlation between a variation in voltage and the capacity after a specified time passes from the point of time when a charge is completed for the nickel-hydrogen battery.

Furthermore, a capacity estimation method using an internal impedance for the purpose of estimating the life of a lead storage battery is put to practical use, and thus, a method for predicting a life by extrapolating a temporal variation in estimated capacity has been proposed (e.g., refer to "Tomonobu Tsujikawa, Tamotsu Motozu, Kunio Nakamura: NTT R&D, vol. 50, No. 8, p. 569 (2001)").

However, in Japanese Patent Laid-Open Publication No. 2005-235420, the battery voltage needs to be measured twice immediately after fully charged and when the specified time passes after fully charged, thereby increasing the number of measurements of the battery voltage.

Particularly, an electric vehicle requiring, for example, a high voltage of 288 to 600 V is provided, for example, with a secondary-battery module formed by connecting in series a plurality of, for example, 240 to 500 cells each having 1.2 V. The secondary-battery module has a high output voltage, thereby making it hard to measure each output voltage of the whole secondary-battery module all at once in a voltage detection circuit which cannot withstand a high voltage. This compels, for example, a plurality of measurements of the terminal voltage of each cell, thereby if each voltage of, for example, 500 cells in series is measured twice, requiring a thousand battery-voltage measurements.

In "Tomonobu Tsujikawa, Tamotsu Motozu, Kunio Nakamura: NTT R&D, vol. 50, No. 8, p. 569 (2001)", the battery internal resistance needs calculating, thereby complicating the calculation process.

SUMMARY OF THE INVENTION

Therefore, it is an object of the present invention to provide a life estimation apparatus and a life estimation method for a secondary battery capable of estimating the life of a secondary battery in a simple manner.

A secondary-battery life estimation apparatus according to an aspect of the present invention includes: a voltage measuring portion measuring a terminal voltage of a secondary battery to be measured; a first memory storing in advance a terminal voltage $V_0$ of a non-degraded secondary battery before the non-degraded secondary battery discharges after fully charged; a second memory which stores in advance a life-estimation data map as a look-up table associating a voltage difference dV between a terminal voltage V of the secondary battery to be measured before the secondary battery to be measured discharges after fully charged and the terminal voltage $V_0$ with a residual life of the secondary battery to be measured; and a CPU calculating the voltage difference dV between the terminal voltage V measured by the voltage measuring portion before the secondary battery to be measured discharges after fully charged and the terminal voltage $V_0$ stored in the first memory and estimating the residual life of the secondary battery to be measured based on the life-estimation data map stored in the second memory using the voltage difference dV.

A secondary-battery life estimation method according to an aspect of the present invention includes: a step of a voltage measuring portion measuring a terminal voltage of a secondary battery to be measured; a step of a first memory storing in advance a terminal voltage $V_0$ of a non-degraded secondary battery before the non-degraded secondary battery discharges after fully charged; a step of a second memory storing in advance a life-estimation data map as a look-up table associating a voltage difference dV between a terminal voltage V of the secondary battery to be measured before the secondary battery to be measured discharges after fully charged and the terminal voltage $V_0$ with a residual life of the secondary battery to be measured; and a step of a CPU calculating the voltage difference dV between the terminal voltage V measured by the voltage measuring portion before the secondary battery to be measured discharges after fully charged and the terminal voltage $V_0$ stored in the first memory and estimating the residual life of the secondary battery to be measured based on the life-estimation data map stored in the second memory using the voltage difference dV.

According to this configuration, the CPU can calculate the voltage difference dV between the terminal voltage V measured by the voltage measuring portion before the secondary battery to be measured discharges after fully charged and the terminal voltage $V_0$ stored in the first memory, and estimate the residual life of the secondary battery to be measured based on the life-estimation data map stored in the second memory using the voltage difference dV. This makes it possible to estimate the life of a secondary battery in a simpler manner than the art of measuring twice the voltage of each battery as described in the Background Art.

These and other objects, features and advantages of the present invention will become more apparent upon reading of the following detailed description along with the accompanied drawings.

DESCRIPTION OF THE PREFERRED EMBODIMENT

The inventors come up with a life estimation apparatus including a voltage measuring portion measuring a voltage of a secondary battery or a secondary-battery module to be measured, a temperature measuring portion measuring a temperature of the secondary battery or secondary-battery module to be measured, and a CPU provided with a memory. The memory has a voltage $V_0$ before a non-degraded product of the secondary battery or the secondary-battery module discharges and a life-estimation data map in storage. The CPU calculates a voltage difference dV between a voltage V before the secondary battery or the secondary-battery module starts to discharge which is measured by the voltage measuring portion and the voltage $V_0$ of the non-degraded product, and estimates a residual life based on the life-estimation data map, using the voltage difference dV and temperature information from the temperature measuring portion. This configuration is capable of estimating the life of the secondary battery in such a simple way only by measuring a single voltage after fully charged. An embodiment of the present invention will be below described with reference to the drawings.

Figure 1:
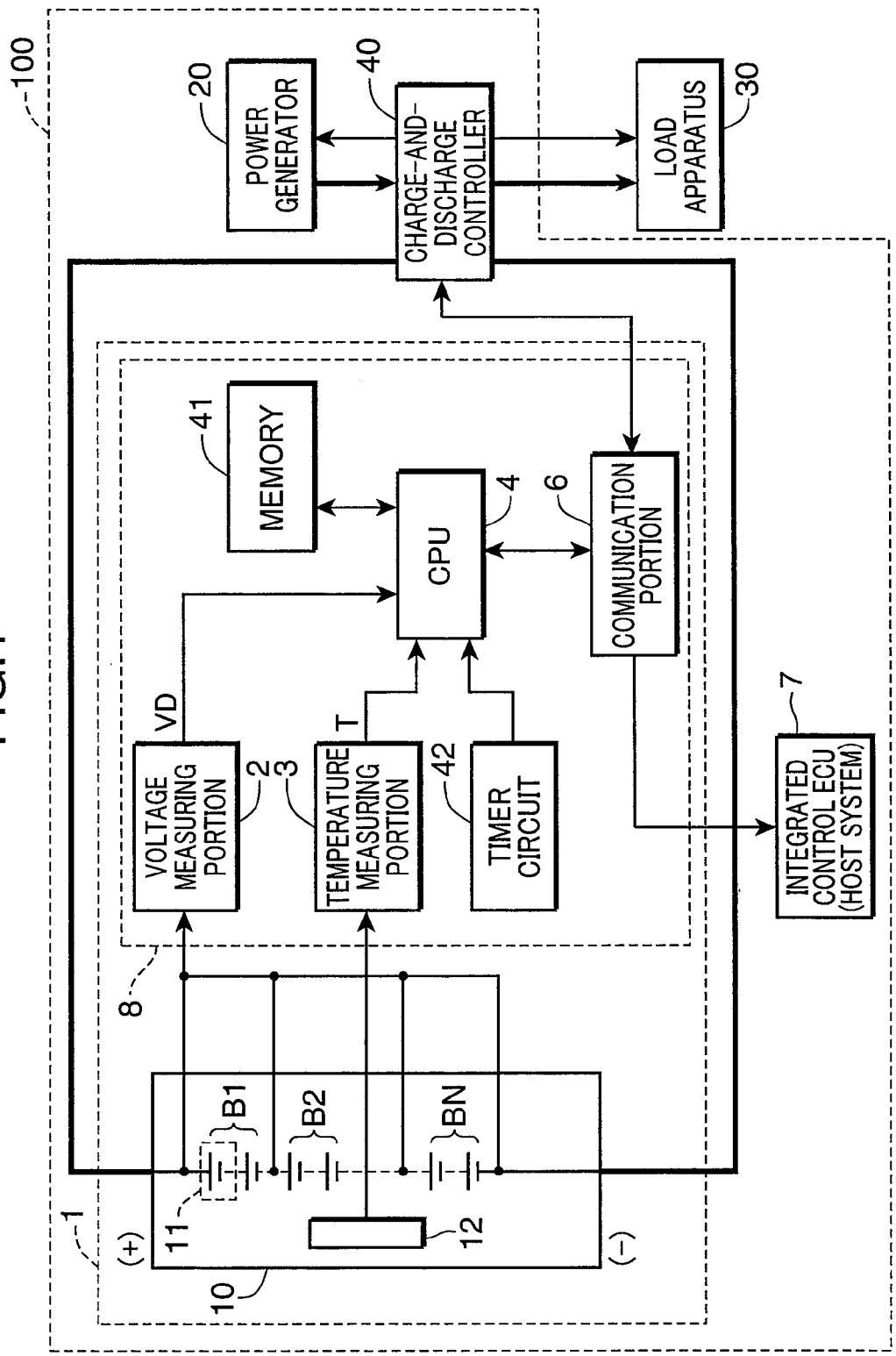
FIG. 1 is a schematic block diagram showing a configuration of a system according to an embodiment of the present invention.

FIG. 1 is a block diagram showing a power supply system provided with a secondary-battery life estimation apparatus according to a first embodiment of the present invention. In FIG. 1, a power supply system 100 includes a control unit 8 and a secondary-battery module 10, an integrated control ECU 7, a power generator 20, a charge-and-discharge controller 40, and a load apparatus 30. The secondary-battery module 10 supplies electric power to the load apparatus 30 via the charge-and-discharge controller 40.

The power generator 20 outputs electric power, and an excess of the electric power to the load apparatus 30 is inputted in the secondary-battery module 10 via the charge-and-discharge controller 40 to thereby charge the secondary-battery module 10. If the electric current sent to the load apparatus 30 sharply increases, or if the power necessary for the load apparatus 30 exceeds the output of the power generator 20 because of some fall in the amount of power generated by the power generator 20, then the secondary-battery module 10 supplies the short electric power to the load apparatus 30 via the charge-and-discharge controller 40.

As the power generator 20, specifically, there is a power generator using natural energy such as a solar-light power generator (solar battery), a dynamo driven by an engine as a mechanical power source, or the like.

Ordinarily in the power supply system 100, the secondary-battery module 10 is controlled in such a way that the SOC is within a range of 20 to 80% or so.

In a load-leveling power supply, a plug-in hybrid electric vehicle or the like which makes effective use of nighttime power, the secondary-battery module 10 is charged up to an SOC of 100% and discharges energy to the load apparatus 30 if necessary.

A power supply system 1 includes the control unit 8 and the secondary-battery module 10. The secondary-battery module 10 includes at least one or more secondary-battery blocks B1, B2, ..., BN connected in series which is housed in a box (not shown). Each secondary-battery block B1, B2, ..., BN is made up of at least one or more secondary batteries 11 connected in series, thereby meaning that the secondary-battery module 10 is formed by the one or more secondary batteries 11.

The secondary battery 11 can be an alkaline storage battery such as a nickel-hydrogen battery, a lithium-ion battery, a lead storage battery or the like. In this case, the secondary battery 11, the secondary-battery blocks B1, B2, ..., BN and the secondary-battery module 10 each correspond to an example of the secondary battery in the claims.

The secondary-battery module 10 has a temperature sensor 12 attached thereto which detects the temperature of the secondary-battery module 10. The battery blocks B1, B2, ..., BN are below referred to as the battery block B without any appendix when generically mentioned while with an appendix when individually indicated.

The control unit 8 includes a voltage measuring portion 2, a temperature measuring portion 3, a CPU (central processing unit) 4, a memory 41 (first and second memories), a timer circuit 42 and a communication portion 6.

The voltage measuring portion 2 measures each terminal voltage of the plurality of secondary-battery blocks B1, B2, ..., BN. The temperature measuring portion 3 measures the temperature of the secondary-battery module 10 using the temperature sensor 12. The CPU 4 stores and calculates data based on terminal voltages V1, V2, ..., VN outputted from the voltage measuring portion 2 and a temperature of the secondary-battery module 10 outputted from the temperature measuring portion 3 to thereby estimate a residual life of the secondary-battery module 10.

The memory 41 is formed, for example, by a non-volatile storage element such as a ROM (read only memory) and an EEPROM (electrically erasable and programmable read only memory). The memory 41 has, as a pre-discharge voltage $V_0$ stored in advance, a terminal voltage of a non-degraded secondary battery (the secondary-battery blocks B1, B2, ..., BN) before the non-degraded secondary battery discharges after fully charged.

The memory 41 has in storage a life-estimation data map as a look-up table for estimating a life. The communication portion 6 transmits a measured value of a voltage, a temperature or the like, or failure information of a current sensor or the like, to the integrated control ECU (host system) 7 controlling the whole system based on the transmitted data. The life estimation apparatus according to the present invention is configured by the voltage measuring portion 2, the temperature measuring portion 3, the memory 41 and the CPU 4 and may be further provided with the charge-and-discharge controller 40.

The integrated control ECU (host system) 7 and the communication portion 6 may communicate together across a CAN (controller area network: registered trademark) and an Ethernet (registered trademark), or by radio or the like.

Each part of the life estimation apparatus will be below described. The voltage measuring portion 2 is formed, for example, by a switching circuit (not shown) selecting any one of the terminal voltages V1, V2, ..., VN, an analog-digital converter converting a voltage selected by the switching circuit into a digital value and outputting it to the CPU 4, or the like. The voltage measuring portion 2 generates voltage data indicating the values of the terminal voltages V1 to VN and outputs it to the CPU 4 at a predetermined cycle.

The temperature measuring portion 3 is formed, for example, by an analog-digital converter converting a voltage outputted by the temperature sensor 12 into a digital value and outputting it to the CPU 4, or the like. The temperature sensor 12 and the temperature measuring portion 3 can measure each temperature of the plurality of secondary batteries 11 or each temperature of the secondary-battery blocks B1, B2, ..., BN, or may measure the temperature of the whole secondary-battery module 10. The temperature measuring portion 3 transforms temperature data into a digital signal and outputs it to the CPU 4 at a predetermined cycle.

Next, a life estimation method will be described. First, the voltage measuring portion 2 measures the terminal voltages V1, V2, ..., VN of the secondary-battery blocks B1, B2, ..., BN, respectively, at the time when a predetermined time elapses after the secondary-battery module 10 comes into a full-charge state, and transmits voltage data indicating the terminal voltages to the CPU 4. The CPU 4 calculates the voltage difference dV between the terminal voltages V1, V2, ..., VN after the predetermined time has passed and the pre-discharge voltage $V_0$ equivalent to the terminal voltage of a brand-new battery (non-degraded secondary battery) at the time when the predetermined time has passed after fully charged.

Then, the temperature measuring portion 3 measures the temperature of each secondary battery, for example, a temperature T of the secondary-battery blocks B1, B2, ..., BN, and transmits the temperature data to the CPU 4. The CPU 4 refers to the life-estimation data map showing a relationship between dV and temperature shown in FIG. 2, and outputs a life data of the secondary battery, for example, a life data of the secondary-battery module 10.

Figure 2:
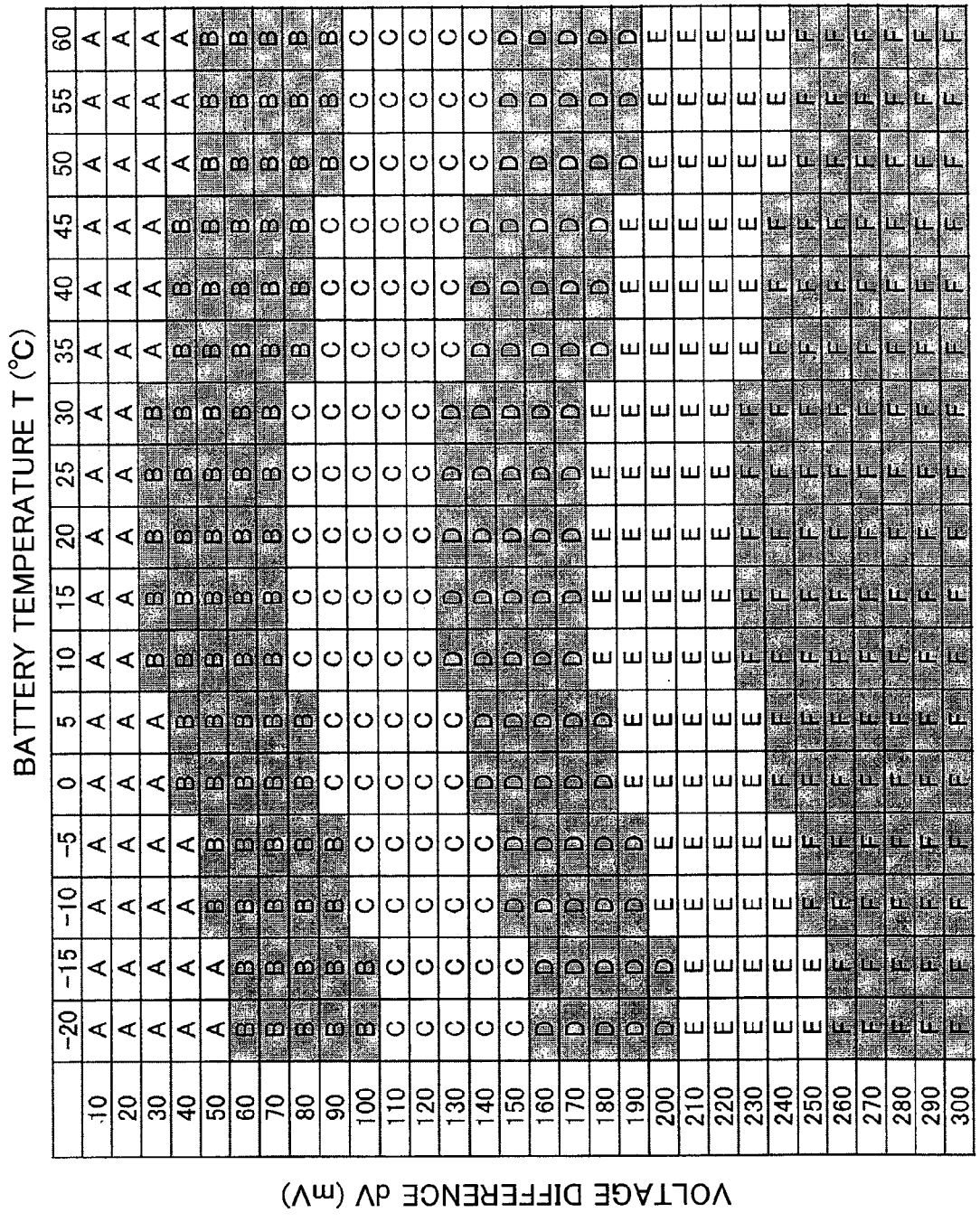
FIG. 2 is a schematic table showing a life-estimation data map according to an embodiment of the present invention.

FIG. 2 is a table showing an example of the life-estimation data map stored in the memory 41. In the life-estimation data map of FIG. 2, the vertical axis indicates the voltage difference dV (mV) and the horizontal axis the battery temperature T (° C.), and the voltage difference dV and the temperature T correlate with a residual-life coefficient K. The smaller the residual-life coefficient K is, the shorter the residual life is.

The residual life of the secondary-battery blocks B1, B2, ..., BN is calculated in the following expression (1).

$$\text{residual life (year)} = K \times \text{new-product life (year)} \tag{1}$$

The new-product life is a period of time until the capacity or impedance of a new non-degraded secondary-battery block is expected not to satisfy a preset reference value when it is used on preset charge-and-discharge conditions under a preset temperature environment. In this example, the residual life is represented by a period of time, however, it may be indicated, for example, by another parameter such as a charge-and-discharge cycle number.

FIG. 2 shows an example in the case of a nickel-hydrogen secondary battery, in which the residual-life coefficient K is given letters having a relationship of A>B>C>D>E>F. As shown in FIG. 2, the life-estimation data map is a look-up table in which using a reference temperature of 20° C., the greater the voltage difference dV becomes, the smaller the residual-life coefficient K becomes (the shorter the residual life becomes), and the greater the difference between the battery temperature T and the reference temperature of 20° C. becomes, the larger the residual-life coefficient K becomes (the longer the residual life becomes).

The nickel-hydrogen secondary battery has the property of increasing the voltage difference dV apparently by raising the internal resistance as the battery temperature T falls, and the property of increasing the voltage difference dV apparently by raising the battery self discharge as the battery temperature T rises. This balances the effect of the internal resistance relative to the battery temperature T with the effect of the self discharge relative to the battery temperature T, thereby producing the battery temperature T for minimizing the voltage difference dV, which is set in advance as the above reference temperature.

In the life-estimation data map of FIG. 2, the residual-life coefficient K is set in such a way that the greater the voltage difference dV becomes, the smaller the residual-life coefficient K becomes (the shorter the residual life becomes) as well as the greater the difference between the battery temperature T and the reference temperature of 20° C. becomes, the larger the residual-life coefficient K becomes (the longer the residual life becomes). This makes it possible to reduce the effect of variations in the internal resistance and the self discharge relative to the battery temperature T upon the voltage difference dV, thereby calculating the residual-life coefficient K more precisely.

Next, an operation for charging a secondary battery fully will be mainly described in the life estimation method for the secondary battery 11 according to the embodiment of the present invention.

Step 1: First, a secondary battery is charged up to a full-charge state. Specifically, the CPU 4 allows the charge-and-discharge controller 40 to charge each secondary battery 11 with a charging current supplied at a preset first current value to the secondary-battery module 10. If at least one of the terminal voltages V1, V2, ..., VN measured by the voltage measuring portion 2 becomes a full-charge voltage of the secondary-battery block B, then the CPU 4 allows the charge-and-discharge controller 40 to charge the secondary-battery module 10 with a charging current reduced to a second current value smaller than the first current value.

Upon sending the charging current to the secondary battery, the terminal voltage of the secondary battery becomes a value made by adding a voltage drop caused by the internal resistance to an OCV (open circuit voltage) of the secondary battery. Therefore, even if the terminal voltage comes to the full-charge voltage when the charging current is the first current value, the OCV has not yet reached the full-charge voltage, and neither has the secondary-battery block B been fully charged. If the charging current is reduced to the second current value, the voltage drop caused by the internal resistance is suppressed to thereby bring the terminal voltage of the secondary-battery block B down below the full-charge voltage.

Sequentially, if at least one of the terminal voltages V1, V2, ..., VN measured by the voltage measuring portion 2 becomes the full-charge voltage of the secondary-battery block B again, then the CPU 4 allows the charge-and-discharge controller 40 to give a trickle charge to the secondary-battery module 10 with a charging current reduced to a third current value smaller than the second current value. Then, the CPU 4 allows the timer circuit 42 to clock a period when the trickle charge continues and allows the charge-and-discharge controller 40 to nullify the charging current and end the charge after the trickle charge continues for a predetermined charging set time.

In this manner, the charging current is gradually decreased, and in the last stage, the trickle charge with a slight electric current continues for the predetermined charging set time, thereby suppressing the impact of the voltage drop caused by the internal resistance of the secondary battery, so that the secondary-battery module 10 can be fully charged accurately.

Step 2: The voltage measuring portion 2 measures the terminal voltages V1, V2, ..., VN of the secondary battery at the point of time when a predetermined time elapses after the trickle charge is completed, and transmits the voltage data to the CPU 4.

Step 3: The temperature measuring portion 3 measures the temperature T of the secondary battery and transmits the temperature data to the CPU 4.

Step 4: The CPU 4 refers to the life-estimation data map showing the relationship between the voltage difference dV and the temperature T and outputs a life data of the secondary battery.

The life estimation method for the secondary battery according to this embodiment can be realized by operating the control CPU 4 of FIG. 1 according to the embodiment. Therefore, the operation of the control unit 8 shown in FIG. 1, particularly, the operation of Steps 2 to 4 will be below described in detail properly with reference to FIG. 1.

Step 5: First in Step 1, a charge to a secondary battery starts.

Step 6: The CPU 4 starts to measure each block voltage using the voltage measuring portion 2, and at the same time, starts a timer.

Step 7: The CPU 4 starts to check a voltage from the secondary-battery block B1 and acquires the terminal voltages V1, V2, ..., VN one after another up to the secondary-battery block BN.

Step 8: The CPU 4 decides whether the charge signal of each secondary battery is turned on.

Step 9: If the charge signal is turned on, as described in Step 1, the CPU 4 decides whether it is fully charged.

Step 10: As described in Step 1, if the trickle charge is given up to the full-charge state, the CPU 4 turns off the charge signal and stops the charge-and-discharge controller 40 from giving the trickle charge.

Step 11: The CPU 4 allows the timer circuit 42 to clock a period of time which has elapsed after the trickle charge is completed, in other words, after the secondary-battery module 10 is fully charged in Step 2. If the period of time clocked by the timer circuit 42 becomes equal to or longer than a preset time ts for stabilizing the terminal voltage of the secondary-battery block B, then the voltage measuring portion 2 measures the terminal voltages V1, V2, ..., VN in response to an instruction from the CPU 4 and transmits the voltage data to the CPU 4. The time ts for the voltage measurement is not especially limited, as long as it is after the predetermined time passes.

Step 12: The CPU 4 calculates the voltage difference dV between each voltage and the $V_0$ of a non-degraded battery at the time when the predetermined time has passed after fully charged. Specifically, the CPU 4 subtracts the pre-discharge voltage $V_0$ from the terminal voltages V1, V2, ..., VN obtained at Step 11 to thereby calculate the voltage difference dV corresponding to each secondary-battery block B1, B2, ..., BN.

Step 13: In response to an instruction from the CPU 4, the temperature measuring portion 3 measures the temperature T of the secondary-battery module 10 and transmits the measured data to the CPU 4.

Step 14: In the estimation data map stored in the memory 41, the CPU 4 acquires the residual-life coefficient K corresponding to the voltage difference dV of each secondary-battery block B calculated at Step 12 and the temperature T obtained at Step 13. Then, the CPU 4 estimates the residual life of each secondary-battery block B by substituting the thus obtained residual-life coefficient K of each secondary-battery block B in the expression (1) described earlier. Sequentially, the CPU 4 estimates the life of the secondary-battery module 10 at the shortest of the thus estimated residual lives of the secondary-battery blocks B.

In Steps 1 to 14 described above, the life of the secondary-battery module 10 can be estimated only by measuring once the terminal voltages V1, V2, ..., VN at the point when the time ts passes after the secondary-battery module 10 is fully charged in Step 11, thereby estimating the life of a secondary battery in a simpler manner than the art of measuring twice the voltage of each battery as described in the Background Art.

It is desirable to set the predetermined time ts after the charge has finished to 30 or more minutes because the voltage of a secondary battery stabilizes in approximately 30 minutes after the charge has ended.

In this embodiment, the configuration of the control unit 8 is not limited to the above example, as long as it has an equivalent function thereto. In addition, as shown in FIG. 2, the residual-life coefficient K varies according to the temperature T less than according to the voltage difference dV, thereby enabling estimation by the voltage difference dV alone, though a residual life can be more precisely estimated based on both the voltage difference dV and the temperature T.

Furthermore, the step of detecting a battery voltage and the step of detecting a battery temperature according to the present invention may also be taken in reverse order or simultaneously.

For example, the control unit 8 according to this embodiment can be realized by executing a program for embodying each processing of FIG. 1 installed in the CPU 4. In this case, a CPU (central processing unit) of a microcomputer functions as an arithmetic portion. Besides, it may be appreciated that a voltage-sensor connection circuit and the CPU 4 function as the voltage measuring portion, or each memory provided in the CPU 4 functions as a storage portion (memory).

Moreover, an aspect can be considered in which the charge-and-discharge controller 40 also function as the control unit 8. In this aspect, the control unit 8 according to this embodiment can be realized by executing a program for embodying each processing of FIG. 1 installed in a microcomputer constituting the charge-and-discharge controller 40.

In addition, estimating the life of a secondary battery is not limited to the example executed by the control unit 8. Alternatively, it may be appreciated that the charge-and-discharge controller 40 or the load apparatus 30 conducts the life estimation by obtaining information on the secondary battery from the control unit 8, or the life estimation is conducted in another such method.

The secondary-battery life estimation apparatus and life estimation method according to the present invention are useful for estimating the residual life of a secondary battery combined with a solar battery or a power generator as a power supply system.

A secondary-battery life estimation apparatus according to an aspect of the present invention includes: a voltage measuring portion measuring a terminal voltage of a secondary battery to be measured; a first memory storing in advance a terminal voltage $V_0$ of a non-degraded secondary battery before the non-degraded secondary battery discharges after fully charged; a second memory which stores in advance a life-estimation data map as a look-up table associating a voltage difference dV between a terminal voltage V of the secondary battery to be measured before the secondary battery to be measured discharges after fully charged and the terminal voltage $V_0$ with a residual life of the secondary battery to be measured; and a CPU calculating the voltage difference dV between the terminal voltage V measured by the voltage measuring portion before the secondary battery to be measured discharges after fully charged and the terminal voltage $V_0$ stored in the first memory and estimating the residual life of the secondary battery to be measured based on the life-estimation data map stored in the second memory using the voltage difference dV.

A secondary-battery life estimation method according to an aspect of the present invention includes: a step of a voltage measuring portion measuring a terminal voltage of a secondary battery to be measured; a step of a first memory storing in advance a terminal voltage $V_0$ of a non-degraded secondary battery before the non-degraded secondary battery discharges after fully charged; a step of a second memory storing in advance a life-estimation data map as a look-up table associating a voltage difference dV between a terminal voltage V of the secondary battery to be measured before the secondary battery to be measured discharges after fully charged and the terminal voltage $V_0$ with a residual life of the secondary battery to be measured; and a step of a CPU calculating the voltage difference dV between the terminal voltage V measured by the voltage measuring portion before the secondary battery to be measured discharges after fully charged and the terminal voltage $V_0$ stored in the first memory and estimating the residual life of the secondary battery to be measured based on the life-estimation data map stored in the second memory using the voltage difference dV.

According to this configuration, the CPU can calculate the voltage difference dV between the terminal voltage V measured by the voltage measuring portion before the secondary battery to be measured discharges after fully charged and the terminal voltage $V_0$ stored in the first memory, and estimate the residual life of the secondary battery to be measured based on the life-estimation data map stored in the second memory using the voltage difference dV. This makes it possible to estimate the life of a secondary battery in a simpler manner than the art of measuring twice the voltage of each battery as described in the Background Art.

Furthermore, preferably, the CPU may allow the voltage measuring portion to measure the terminal voltage V when a preset time elapses for stabilizing the terminal voltage of the secondary battery to be measured since this secondary battery is fully charged and before the secondary battery discharges.

According to this configuration, the voltage measuring portion measures the terminal voltage V when the terminal voltage of the secondary battery to be measured stabilizes after it is fully charged, thereby measuring the terminal voltage V more precisely, so that the life can be more accurately estimated.

Moreover, it is preferable that a temperature measuring portion measuring a temperature of the secondary battery to be measured is further provided, in which: the life-estimation data map is a look-up table associating the voltage difference dV and the temperature of the secondary battery to be measured with the residual life of the secondary battery to be measured; and the CPU estimates the residual life of the secondary battery to be measured by acquiring the residual life associated with the calculated voltage difference dV and the temperature measured by the temperature measuring portion in the life-estimation data map stored in the second memory.

According to this configuration, the residual life of the secondary battery to be measured is estimated based on the voltage difference dV and the temperature of the secondary battery. Therefore, the temperature has less effect on the terminal voltage than estimating the residual life of the secondary battery only based on the voltage difference dV, thereby making it possible to estimate the life more precisely.

In addition, preferably, the life-estimation data map may be a look-up table indicating that the wider the voltage difference dV becomes, the shorter the residual life becomes.

Since the secondary battery has the wider voltage difference dV as it becomes worse, the look-up table indicating that the wider the voltage difference dV becomes, the shorter the residual life becomes is suitable as the life-estimation data map.

Furthermore, preferably, the life-estimation data map may be a look-up table indicating that the wider the voltage difference dV becomes, the shorter the residual life becomes, and the wider the difference between the temperature of the secondary battery to be measured and a predetermined reference temperature, the longer the residual life becomes.

In estimating the life of the secondary battery which has the property of increasing the voltage difference dV apparently by raising the internal resistance as the temperature falls and the property of increasing the voltage difference dV apparently by raising the battery self discharge as the temperature rises, this life-estimation data map can reduce the effect of variations in the internal resistance and the self discharge relative to the battery temperature upon the voltage difference dV, thereby calculating the residual life more precisely.

Moreover, preferably, the secondary battery may be a nickel-hydrogen secondary battery.

The nickel-hydrogen secondary battery has the property of increasing the voltage difference dV apparently by raising the internal resistance as the temperature falls and the property of increasing the voltage difference dV apparently by raising the battery self discharge as the temperature rises, thereby making the life-estimation data map suitable.

In addition, preferably, the secondary battery may be a battery block formed by a plurality of cells.

This configuration enables the battery block formed by a plurality of cells to be employed as the secondary battery.

Furthermore, it is preferable that a plurality of the secondary batteries are combined into a secondary-battery module; the voltage measuring portion measures each terminal voltage of the plurality of secondary batteries; and the CPU estimates each residual life of the plurality of secondary batteries and estimates the life of the secondary-battery module at the shortest of the estimated residual lives.

According to this configuration, a secondary-battery module is formed by combining a plurality of the secondary batteries each corresponding to the battery block including a plurality of cells. In estimating the life of the secondary-battery module, the terminal voltage is measured for each battery block, thereby making the number of terminal-voltage measurements smaller than measuring the terminal voltage for each cell.

Moreover, preferably, a charge-and-discharge controller may be further provided which charges the secondary battery fully by charging the secondary battery with a charging current supplied at a preset first current value, charging the secondary battery with a charging current reduced to a second current value smaller than the first current value when the terminal voltage of the secondary battery measured by the voltage measuring portion becomes a full-charge voltage, and further charging the secondary battery for a predetermined charging set time with a charging current reduced to a third current value smaller than the second current value when the terminal voltage of the secondary battery measured by the voltage measuring portion becomes the full-charge voltage again.

According to this configuration, the charging current is gradually decreased, and in the last stage, the charge with the minimum electric current continues for the predetermined charging set time, thereby suppressing the impact of a voltage drop caused by the internal resistance of the secondary battery, so that the secondary battery can be fully charged with precision.

In addition, it is preferable that the secondary-battery life estimation apparatus further includes: a temperature measuring portion measuring a temperature of the secondary battery to be measured; and a charge-and-discharge controller which charges the secondary battery fully by charging the secondary battery with a charging current supplied at a preset first current value, charging the secondary battery with a charging current reduced to a second current value smaller than the first current value when the terminal voltage of the secondary battery measured by the voltage measuring portion becomes a full-charge voltage, and further charging the secondary battery for a predetermined charging set time with a charging current reduced to a third current value smaller than the second current value when the terminal voltage of the secondary battery measured by the voltage measuring portion becomes the full-charge voltage again, in which: the life-estimation data map is a look-up table associating the voltage difference dV and the temperature of the secondary battery to be measured with the residual life of the secondary battery to be measured and indicating that the wider the voltage difference dV becomes, the shorter the residual life becomes, and the wider the difference between the temperature of the secondary battery to be measured and a predetermined reference temperature, the longer the residual life becomes; and the CPU allows the voltage measuring portion to measure the terminal voltage V when a preset time elapses for stabilizing the terminal voltage of the secondary battery to be measured since this secondary battery is fully charged and before the secondary battery discharges, and estimates the residual life of the secondary battery to be measured by acquiring the residual life associated with the calculated voltage difference dV and the temperature measured by the temperature measuring portion in the life-estimation data map stored in the second memory.

This configuration makes it possible to estimate the life of a secondary battery in a simpler manner than the art of measuring twice the voltage of each battery as described in the Background Art.

This application is based on Japanese patent application serial No. 2007-232332, filed in Japan Patent Office on Sep. 7, 2007, the contents of which are hereby incorporated by reference.

Although the present invention has been fully described by way of example with reference to the accompanied drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A secondary-battery life estimation apparatus, comprising:
   a voltage measuring portion configured to measure a terminal voltage V of a secondary battery;
   a first memory configured to store in advance a terminal voltage $V_0$ of a non-degraded secondary battery before the non-degraded secondary battery discharges after a preset time for stabilizing a terminal voltage V of the non-degraded secondary battery elapses since the non-degraded secondary battery is fully charged and charge thereof is terminated;
   a second memory configured to store in advance a life-estimation data map as a look-up table associating a voltage difference dV between a terminal voltage V of the secondary battery before the secondary battery discharges after the preset time elapses since the secondary battery is fully charged and charge thereof is terminated, and the terminal voltage $V_0$ with a residual life of the secondary battery; and
   a CPU configured to calculate the voltage difference dV between the terminal voltage V measured by the voltage measuring portion before the secondary battery discharges after the preset time elapses since the secondary battery is fully charged and charge thereof is terminated, and the terminal voltage $V_0$ stored in the first memory and estimate the residual life of the secondary battery based on the life-estimation data map stored in the second memory using the calculated voltage difference dV.

2. The secondary-battery life estimation apparatus according to claim 1, wherein the secondary-battery life estimation apparatus further comprising a timer for clocking the preset time.

3. The secondary-battery life estimation apparatus according to claim 1, further comprising a temperature measuring portion configured to measure a temperature of the secondary battery, wherein:
the life-estimation data map is a look-up table associating the voltage difference dV and the temperature of the secondary battery with the residual life of the secondary battery; and
the CPU estimates the residual life of the secondary battery by acquiring the residual life associated with the calculated voltage difference dV and the temperature measured by the temperature measuring portion in the life-estimation data map stored in the second memory.

4. The secondary-battery life estimation apparatus according to claim 1, wherein the life-estimation data map is a look-up table indicating that the wider the voltage difference dV becomes, the shorter the residual life becomes.

5. The secondary-battery life estimation apparatus according to claim 3, wherein the life-estimation data map is a look-up table indicating that the wider the voltage difference dV becomes, the shorter the residual life becomes, and the wider the difference between the temperature of the secondary battery and a predetermined reference temperature, the longer the residual life becomes.

6. The secondary-battery life estimation apparatus according to claim 5, wherein the secondary battery is a nickel-hydrogen secondary battery.

7. The secondary-battery life estimation apparatus according to claim 1, wherein the secondary battery is a battery block formed by a plurality of cells.

8. The secondary-battery life estimation apparatus according to claim 7, wherein:
a plurality of the secondary batteries are combined into a secondary-battery module;
the voltage measuring portion measures a terminal voltage of each of the plurality of secondary batteries; and
the CPU estimates a residual life of each of the plurality of secondary batteries and estimates the life of the secondary-battery module to be the shortest of the estimated residual lives.

9. The secondary-battery life estimation apparatus according to claim 1, further comprising a charge-and-discharge controller configured to charge the secondary battery fully by charging the secondary battery with a charging current supplied at a preset first current value, charging the secondary battery with a charging current reduced to a second current value smaller than the first current value when the terminal voltage of the secondary battery measured by the voltage measuring portion becomes a full-charge voltage, and further charging the secondary battery for a predetermined charging set time with a charging current reduced to a third current value smaller than the second current value when the terminal voltage of the secondary battery measured by the voltage measuring portion becomes the full-charge voltage again; and
a timer for clocking the predetermined charging set time.

10. The secondary-battery life estimation apparatus according to claim 1, further comprising:
a temperature measuring portion configured to measure a temperature of the secondary battery; and
a charge-and-discharge controller configured to charge the secondary battery fully by charging the secondary battery with a charging current supplied at a preset first current value, charging the secondary battery with a charging current reduced to a second current value smaller than the first current value when the terminal voltage of the secondary battery measured by the voltage measuring portion becomes a full-charge voltage, and further charging the secondary battery for a predetermined charging set time with a charging current reduced to a third current value smaller than the second current value when the terminal voltage of the secondary battery measured by the voltage measuring portion becomes the full-charge voltage again, wherein:
the life-estimation data map is a look-up table associating the voltage difference dV and the temperature of the secondary battery with the residual life of the secondary battery and indicating that the wider the voltage difference dV becomes, the shorter the residual life becomes, and the wider the difference between the temperature of the secondary battery and a predetermined reference temperature, the longer the residual life becomes; and
the CPU allows the voltage measuring portion to measure the terminal voltage V after a preset time stabilizing the terminal voltage of the secondary battery elapses since the secondary battery is fully charged and before the secondary battery discharges, and estimates the residual life of the secondary battery by acquiring the residual life associated with the calculated voltage difference dV and the temperature measured by the temperature measuring portion in the life-estimation data map stored in the second memory, the secondary-battery life estimation apparatus further comprising a timer for clocking the predetermined charging set time and the preset time.

11. A secondary-battery life estimation method, comprising:
a step of a voltage measuring portion measuring a terminal voltage V of a secondary battery;
a step of a first memory storing in advance a terminal voltage $V_0$ of a non-degraded secondary battery before the non-degraded secondary battery discharges after a preset time for stabilizing a terminal voltage V of the non-degraded secondary battery elapses since the non-degraded secondary battery is fully charged and charge thereof is terminated;
a step of a second memory storing in advance a life-estimation data map as a look-up table associating a voltage difference dV between a terminal voltage V of the secondary battery before the secondary battery discharges after the preset time elapses since the secondary battery is fully charged and charge thereof is terminated, and the terminal voltage $V_0$ with a residual life of the secondary battery; and
a step of a CPU calculating the voltage difference dV between the terminal voltage V measured by the voltage measuring portion before the secondary battery discharges after the preset time elapses since the secondary battery is fully charged and charge thereof is terminated, and the terminal voltage $V_0$ stored in the first memory and estimating the residual life of the secondary battery based on the life-estimation data map stored in the second memory using the calculated voltage difference dV.

* * * * *